United States Patent
O'Mahony

(10) Patent No.: US 7,522,928 B2
(45) Date of Patent: Apr. 21, 2009

(54) DYNAMIC EMI (ELECTROMAGNETIC INTERFERENCE) MANAGEMENT

(75) Inventor: Barry A. O'Mahony, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 607 days.

(21) Appl. No.: 10/692,965

(22) Filed: Oct. 24, 2003

(65) Prior Publication Data

US 2005/0101359 A1    May 12, 2005

(51) Int. Cl.
    *H04B 7/01*    (2006.01)
(52) U.S. Cl. ............ 455/501; 455/63.1; 455/561; 455/570
(58) Field of Classification Search ........... 455/41.2, 455/41.1, 39, 512–513, 500, 67.11, 550.1, 455/456.1, 486.3
See application file for complete search history.

(56) References Cited

U.S. PATENT DOCUMENTS

| | | | |
|---|---|---|---|
| 5,276,277 A * | 1/1994 | Hightower et al. ........ 174/376 |
| 5,410,737 A | 4/1995 | Jones | |
| 5,448,754 A | 9/1995 | Ho et al. | |
| 5,496,966 A * | 3/1996 | Hightower et al. ........ 174/353 |
| 5,511,233 A | 4/1996 | Otten | |
| 5,859,878 A * | 1/1999 | Phillips et al. ........ 375/316 |
| 5,991,279 A * | 11/1999 | Haugli et al. ........ 370/311 |
| 6,252,540 B1 * | 6/2001 | Hale et al. ........ 342/159 |
| 6,542,740 B1 * | 4/2003 | Olgaard et al. ........ 455/432.1 |
| 6,960,961 B2 * | 11/2005 | Andrews ........ 331/18 |
| 7,106,833 B2 * | 9/2006 | Kerpez ........ 379/1.03 |
| 2002/0142724 A1 | 10/2002 | Nakano | |

FOREIGN PATENT DOCUMENTS

WO    WO 01/97430    12/2001

OTHER PUBLICATIONS

2003 CFR Title 47, vol. 1, FCC Rules, Chapter 1, Part 15—Radio Frequency Devices, pp. 1-190. Retrieved from the internet at: http/www.access.gpo.gov/nars/cfr/waisidx_03/47cfr15_03.html. Retrieved on Feb. 7, 2006.
International Search Report of the Inernational Searching Authority; Dated Sep. 2, 2005; PCT/US2004/035207 (3 pgs).

* cited by examiner

*Primary Examiner*—Tony T Nguyen
(74) *Attorney, Agent, or Firm*—Caroline M. Fleming

(57) ABSTRACT

In one embodiment, a method is provided. The method may include determining if electromagnetic interference (EMI) is emitted by a device in one or more regions of an electromagnetic spectrum occupied by other users, and if it is determined that EMI is emitted by the device in one or more regions of the electromagnetic spectrum occupied by other users, reducing the EMI in the one or more regions, and increasing the EMI in one or more other regions unoccupied by the other users.

14 Claims, 4 Drawing Sheets

DYNAMIC EMI (ELECTROMAGNETIC INTERFERENCE) MANAGEMENT

FIELD

Embodiments of this invention relate to the field of dynamic electromagnetic interference (hereinafter "EMI") management.

BACKGROUND

In the course of operation of a device, the device may emit EMI (hereinafter "electromagnetic interference") into an electromagnetic spectrum, such as a radio frequency (hereinafter "RF") spectrum. The RF spectrum is regulated by the FCC (Federal Communications Commission), and rules regarding the use thereof is proscribed under Part 15 of the FCC Rules (Code of Federal Regulations, Title 17, hereinafter referred to as "FCC Rules"). Under the FCC Rules, for example, a device that unintentionally or incidentally emits EMI must maintain EMI levels below a fixed, predetermined level.

In non-communications devices, the emitted EMI may nevertheless exceed the defined (by the FCC, for example) EMI levels for some frequencies. In communications devices, a conflict may exist between increasing the transmission capacity of the device on a given channel, and maintaining the EMI at acceptable levels, such as those defined by the FCC. The following Shannon equation, which gives the transmission capacity of a given channel, may illustrate a source of this conflict:

$$C = \int \log_2\left(1 + \frac{s(f)}{N(f)}\right) df$$

where C is the channel capacity in bits/second, s(f) is the received signal PSD (power spectral density) in watts/Hz, and N(f) is the noise PSD in watts/Hz. The channel capacity may be improved by factors such as improved coding schemes, techniques which help to reduce the effective noise level, such as crosstalk cancellation, and increasing the received signal PSD. For a given channel with a given response, however, an increase in s(f) may result in an increase in launch power, i.e., an increase in the power of the signal injected into the channel by the device. Unfortunately, increasing the launch power may result in increasing the EMI beyond acceptable levels.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION

Embodiments of the present invention include various operations, which will be described below. The operations associated with embodiments of the present invention may be performed by hardware components or may be embodied in machine-executable instructions, which when executed may result in a general-purpose or special-purpose processor or logic circuits programmed with the instructions performing the operations. Alternatively, and/or additionally, some or all of the operations may be performed by a combination of hardware and software.

Embodiments of the present invention may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments of the present invention. A machine-readable medium may include, but is not limited to, floppy diskettes, optical disks, CD-ROMs (Compact Disc-Read Only Memories), and magneto-optical disks, ROMs (Read Only Memories), RAMs (Random Access Memories), EPROMs (Erasable Programmable Read Only Memories), EEPROMs (Electromagnetic Erasable Programmable Read Only Memories), magnetic or optical cards, flash memory, or other type of media/machine-readable medium suitable for storing such machine-executable instructions.

Moreover, embodiments of the present invention may also be downloaded as a computer program product, wherein the program may be transferred from a remote computer (e.g., a server) to a requesting computer (e.g., a client) by way of one or more data signals embodied in and/or modulated by a carrier wave or other propagation medium via a communication link (e.g., a modem and/or network connection). Accordingly, as used herein, a machine-readable medium may, but is not required to, comprise such a carrier wave.

Examples described below are for illustrative purposes only, and are in no way intended to limit embodiments of the invention. Thus, where examples may be described in detail, or where a list of examples may be provided, it should be understood that the examples are not to be construed as exhaustive, and do not limit embodiments of the invention to the examples described and/or illustrated.

The functionality of each component as described below may be implemented in hardware as circuits. As used herein, a circuit that carries out certain functionality may comprise circuitry (which may be a single circuit, or a plurality of circuits), and may be programmed with instructions to perform the functionality. A circuit may comprise a digital circuit, an analog circuit, a state machine, programmable circuitry, and/or an ASIC (application specific integrated circuit).

Introduction

Figure 1:
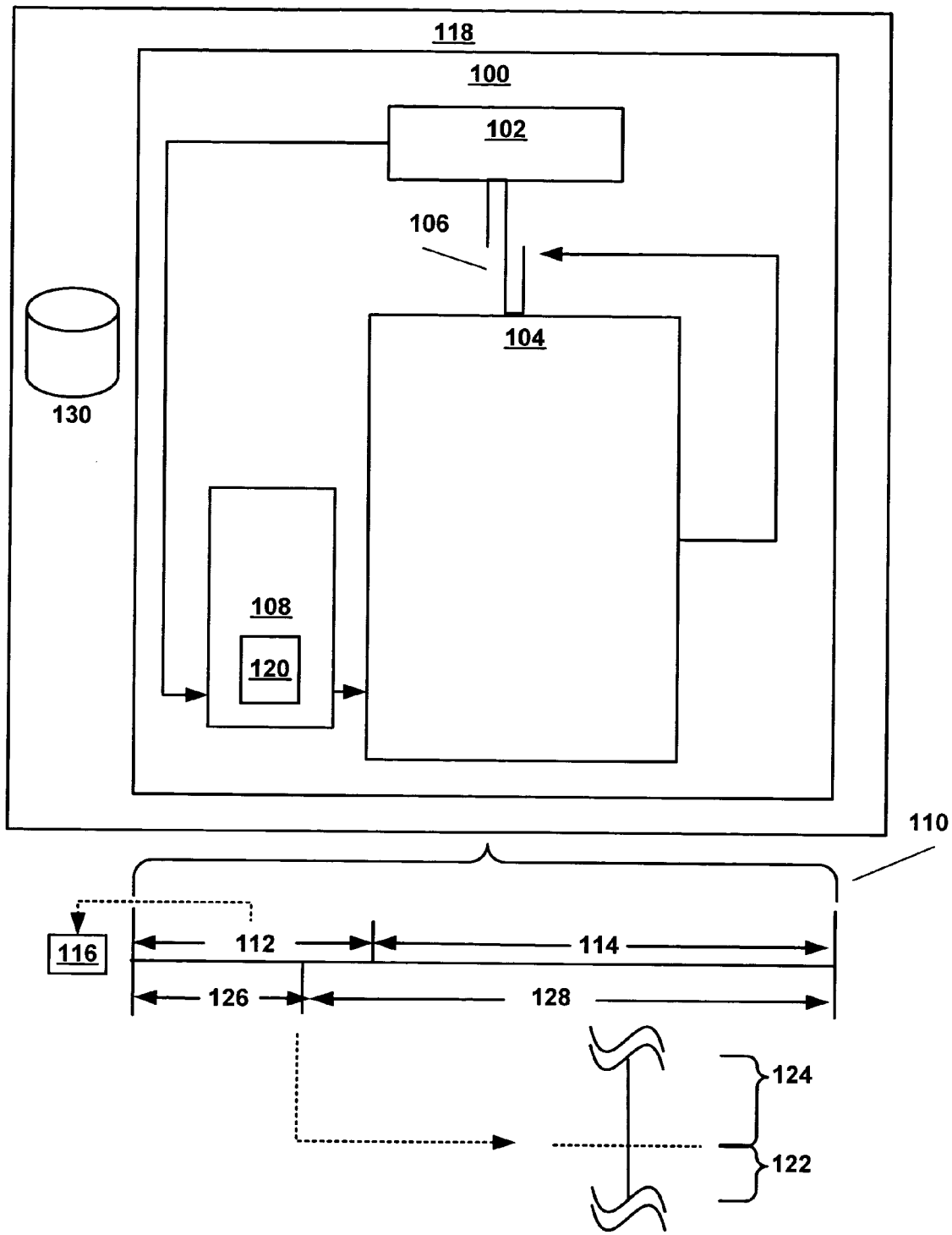
FIG. 1 is a diagram illustrating a system embodiment.
Figure 2:
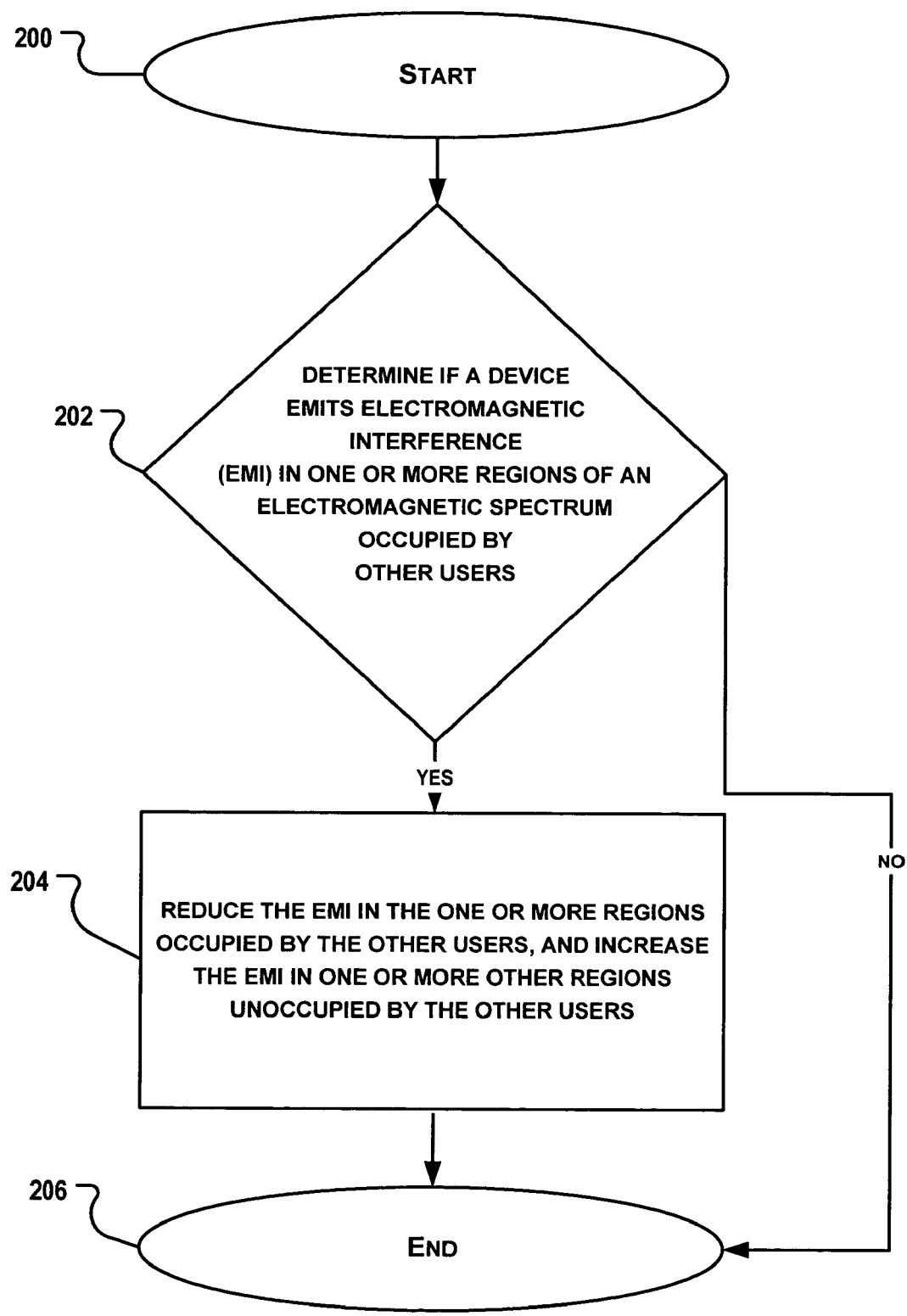
FIG. 2 is a flowchart illustrating a method according to an embodiment.

FIG. 1 illustrates a system 100 in accordance with an embodiment of the invention, and FIG. 2 illustrates a method in accordance with an embodiment of the invention. The method begins at block 200 and continues to block 202 where circuitry 104 may determine if a device 102 emits EMI 106 in one or more regions 112 of an electromagnetic spectrum 110 occupied by other users 116. At block 204, if circuitry 104 determines that the device 102 emits EMI 106 in one or more regions 112 of the electromagnetic spectrum 110 occupied by other users 116, then circuitry 104 may reduce the EMI 106 in the one or more regions 112 occupied by the other users 116, and increase the EMI 106 in one or more other regions 114 unoccupied by the other users 116. The method ends at block 206. If it is determined that the device 102 does not emit EMI 106 in one or more regions 112 of the electromagnetic spectrum 110 occupied by other users 116, then the method ends at block 206.

Figure 3:
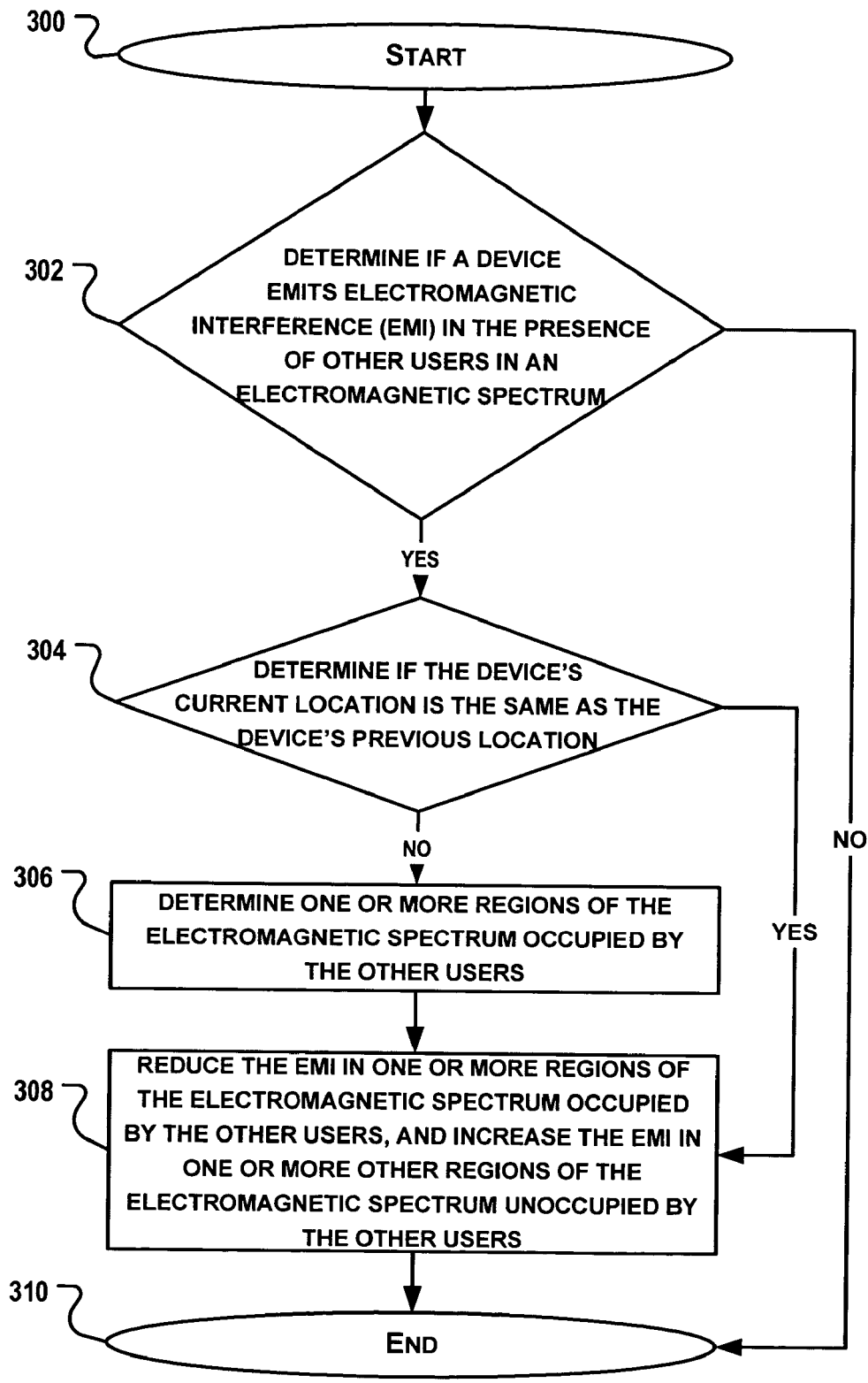
FIG. 3 is a flowchart illustrating a method according to another embodiment.

FIG. 3 illustrates a method in accordance with another embodiment of the invention. The method begins at block 300 and continues to block 302 where circuitry 104 may determine if a device 102 emits EMI 106 in the presence of other users 116 in an electromagnetic spectrum 110. If it is determined that the device 102 emits EMI 106 in the presence of other users 116 in the electromagnetic spectrum 110, then at block 304 circuitry 104 may determine if the device's 102 current location 118 is the same as its previous location 120. At block 308, if the device's 102 current location 118 is the same as its previous location 120, then circuitry 104 may reduce the EMI 106 of the device 102 in one or more regions 112 of an electromagnetic spectrum 110 occupied by the other users 116, and increase the EMI 106 in one or more other regions 114 in the electromagnetic spectrum 110 unoccupied by the other users 116. The method ends at block 310.

If at block 302 it is determined that the device 102 does not emit EMI 106 in the presence of other users 116 in the electromagnetic spectrum 110, then the method ends at block 310. If at block 304 it is determined that the device's 102 current location 118 is not the same as its previous location 120, then at block 306, circuitry 104 may determine one or more regions 112 of the electromagnetic spectrum 110 occupied by the other users 116. The method continues to block 308, as described above, and ends at block 310.

Circuitry 104 may determine if a device's 102 current location 118 is the same as its previous location 120 by using a memory 108. Memory 108 may store a previous location 120 of the device. In one embodiment, for example, a device 102 may store its location in memory 108. To determine if the device's 102 current location 118 has changed from its previous location 120, circuitry 104 may compare the location 120 stored in the memory 108 to the device's 102 currently determined location 118. While memory 108 is shown as located outside of device 102, memory 108 is not restricted to this location, and may reside anywhere. For example, memory 108 may reside on the device 102 itself, and circuitry 104 may access memory 108 on device 102.

Figure 4:
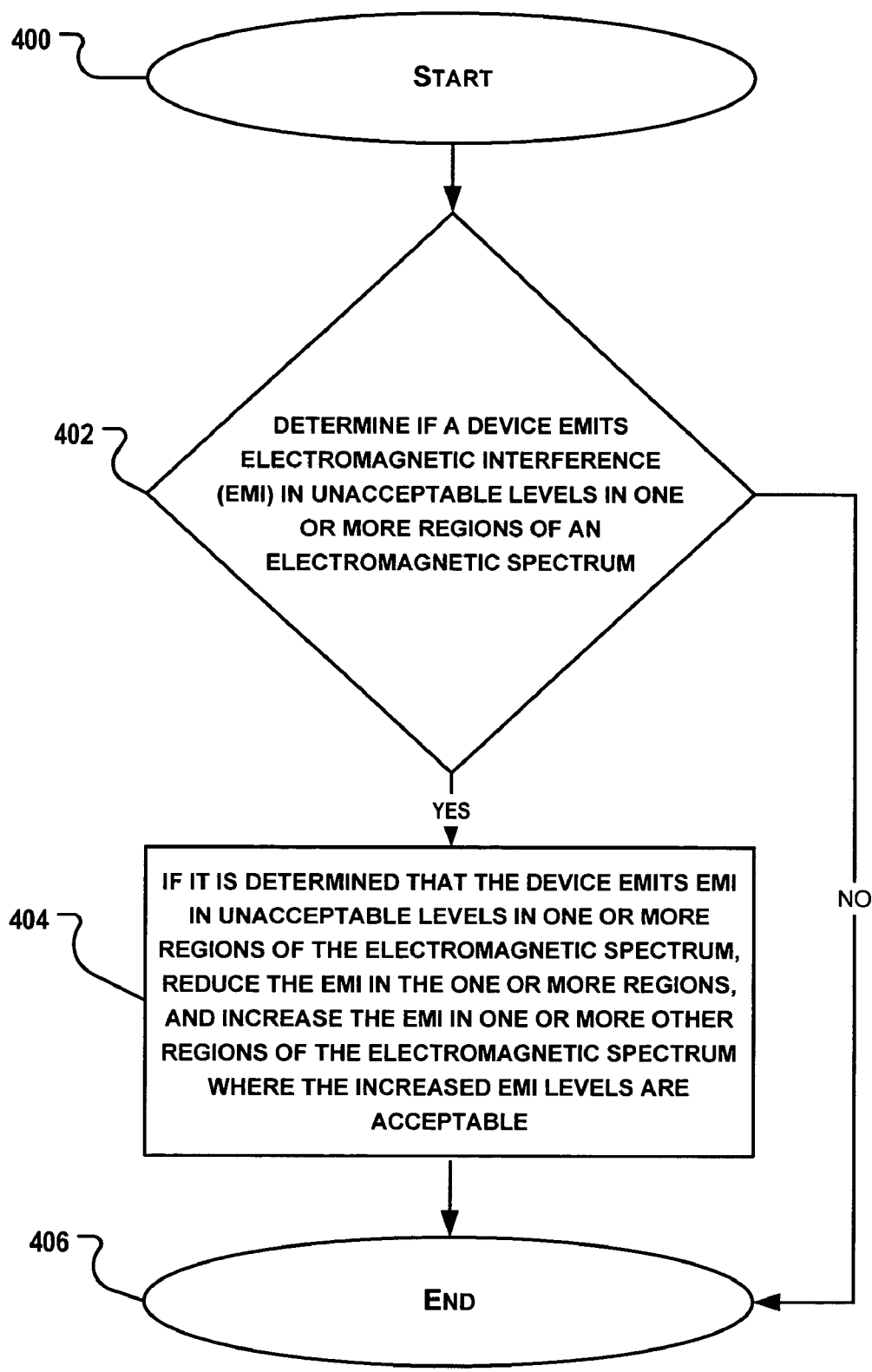
FIG. 4 is a flowchart illustrating a method according to another embodiment.

Another embodiment of a method is illustrated in FIG. 4, which begins at block 400 and continues to block 402 where circuitry 104 may determine if a device 102 emits EMI 106 in unacceptable levels 124 in or more regions 126 of an electromagnetic spectrum 110. At block 404, if circuitry 104 determines that the device 102 emits EMI 106 in unacceptable levels 124 in one or more regions 126 of the electromagnetic spectrum 110, then circuitry 104 may reduce EMI 106 in the one or more regions 126, and increase EMI 106 in one or more other regions 128 of the electromagnetic spectrum 110 where the increased EMI 106 levels are acceptable 122. The method ends at block 406. If it is determined that the device 102 does not emit EMI 106 in unacceptable levels 124 (i.e., levels are acceptable 122) in one or more regions 126 of the electromagnetic spectrum 110, then the method ends at block 406.

In FIG. 1, electromagnetic spectrum 110 may comprise a portion of a full electromagnetic spectrum. Also, regions 112, 114, 126, 128 may be arbitrary regions within a full electromagnetic spectrum, such as regions in electromagnetic spectrum 110. Regions 112, 114, 126, 128 should not be construed as specific ranges, or specific portions, and should not be construed as being limited to portions of a full electromagnetic spectrum. Rather, regions 112, 114, 126, 128 are illustrative, and are intended to illustrate occupied regions 112 relative to unoccupied regions 114, and/or regions where particular EMI emissions are unacceptable 126 as opposed to acceptable 128.

As used herein, "EMI" 106 may refer to interference that may potentially disrupt, degrade or otherwise interfere with electromagnetic radiation emitted within one or more regions of an electromagnetic spectrum 110. Other EMI 106 may include microwave interference, and radio frequency. An electromagnetic spectrum 110 may include a radio frequency spectrum, for example.

In one embodiment, circuitry 104 may additionally determine whether a device 102 unintentionally emits EMI 106. As used herein, a device 102 may unintentionally emit EMI 106 if its emission of EMI 106 is incidental to its operation and/or is not deliberate to its operation. A device 102 my incidentally emit EMI 106 if the device 102 is likely to emit EMI 106, but its emission may be unpredictable in the course of operation, or may be a minor accompaniment to its operation. In one embodiment, a device 102 may incidentally emit EMI 106 if it "generates radio frequency energy during the course of its operation although the device is not intentionally designed to generate or emit radio frequency energy." FCC Rules, Rule 15, Section 15.3(n).

A device 102 that emits EMI where the emission is not deliberate to its operation may be a device that emits EMI 106 as an unintended result of its operation. In one embodiment, a device 102 emits EMI 106 as an unintended result of its operation if it "generates radio frequency energy for use within the device, or . . . sends radio frequency signals by conduction to associated equipment via connecting wiring, but which is not intended to emit RF energy by radiation or induction." FCC Rules, Rule 15, Section 15.3(z).

A device 102 that may unintentionally emit EMI 106 may comprise a non-communications device or a communications device. A PC (personal computer) is an example of a non-communications device, and a DSL (Digital Subscriber Line) transceiver is an example of a communications device. These are simply examples for illustrative purposes only, and are not intended to limit embodiments of the invention.

A "user" may be a transmitter (and/or receiver) that may communicate using a specific transmit and receive frequency combination. In embodiments of the invention, a user may comprise a device 102 that intentionally, unintentionally, and/or incidentally emits EMI 106 into one or more regions 112, 114, 124, 126 of an electromagnetic spectrum 110. A user may be an active user and/or a licensed user. A licensed user may be a user that has a frequency (specific frequency or a range) assigned to it. Frequencies may be assigned to users by the FCC, for example, and may be coordinated with other users of the same radio frequency spectrum in the same geographical area. An active user may be a user that may communicate concurrently as a device checking for the presence of other users. In embodiments of the invention, a user may be a licensed user (active or inactive), and/or an active user (licensed or unlicensed).

As used herein, a "region" may include a specific frequency, or a range of frequencies. Thus, "one or more regions" may include any combination of one or more specific frequencies and/or one or more range of frequencies. In a radio frequency spectrum, for example, a region may comprise a specific radio frequency, such as 130.5 MHZ (MegaHertz). Alternatively, a region may comprise a range of radio frequencies, such as 140.5 MHz to 150.5 MHz. One or more regions may include radio frequencies 120.5 MHz and/or 130.5 MHz, and/or 140.5 MHz to 150.5 MHz, for example.

"Acceptable level" 122, as used herein, may refer to an amount of emitted EMI 106 that may be permitted in accordance with a predetermined standard and/or at or below a predetermined threshold. An acceptable level 122 of EMI may be pre-defined, such as by the FCC, or dynamic. Conversely, an "unacceptable level" 124, as used herein, may refer an amount of emitted EMI 106 that may not be permitted in accordance with a predetermined standard and/or above a predetermined threshold. An acceptable level 122 of EMI 106 may differ from one region to another region in an electromagnetic spectrum 110. Also, an acceptable level 122 of EMI 306 may differ for different devices, and/or be dependent on other factors.

In one embodiment, EMI 106 may be altered if there are other users 116 present, whether EMI levels may be acceptable 122 or unacceptable 124. In another embodiment, EMI 106 may be altered if EMI levels are unacceptable 124 whether other users 116 may be present. In still other embodiments, EMI 106 may be altered if EMI levels are unacceptable 124, and there are other users 116 present.

Determining if a Device Emits EMI into a Region Occupied by Other Users.

In one embodiment, determining if a device 102 emits EMI 106 into one or more regions 112 occupied by other users 116 may comprise determining a presence of other users 116 at the device's location 118, and if there are other users 116 present at that location 118, determining one or more regions 112 of the electromagnetic spectrum 110 occupied by the other users 116 at that location 118.

In one embodiment, the presence of other users 116 at the device's location 118 may comprise accessing a database 130 of users at the device's location 118. A device's location 118 may be determined by obtaining location information from a GPS (Global Positioning System), for example. Other means, such as triangulation, may be used. These are merely examples, and other methods existing now and not mentioned herein, or which may exist in the future may be used. The determined device location 118 may be correlated with a database 130 of users at the location 118. One or more users in database 130 may mean that other users are present. For example, if the device 102 knows it is located in a certain metropolitan area (i.e., location), it can determine which regions of the radio and TV broadcast spectrum are occupied and unoccupied by local users.

In another embodiment, the presence of other users 116 at the device's location 118 may be determined by listening to the electromagnetic spectrum 110. By the principle of reciprocity, devices 102 that may be efficient generators of EMI at a given frequency may also be capable of efficiently listening at that frequency. An example of this may include DMT (Discrete Multitone) DSL transceivers, which may use adaptive water-filling algorithms for performing bit-loading of the frequency bins. In the presence of licensed radio users, for example, such modems may use convert tonal techniques to detect the coupling of radio signals to the twisted-pair line.

Determining one or more regions 112 of the electromagnetic spectrum 110 occupied by the other users 116 at a device's location 118 may comprise, for example, accessing a database 130 of users at the device's location. Database 130 may comprise a list of one or more users, as well as one or more regions occupied by the one or more users.

In one embodiment, if circuitry 104 determines that the device's 102 current location 118 is the same as the device's previous location 120, then circuitry 104 may reduce the EMI 106 in the one or more regions 112 of the electromagnetic spectrum 110 occupied by the other users 116, and increase the EMI 106 in the one or more other regions 114 of the electromagnetic spectrum 110 unoccupied by the other users 116. If the current location 118 is not the same as the device's previous location 120, then circuitry 104 may first determine the one or more regions 112 of the electromagnetic spectrum 110 occupied by the other users 116 at a device's location 118.

Reducing EMI in Occupied Regions, and Increasing EMI in Unoccupied Regions

EMI 106 emissions may be reduced in occupied regions 112, and increased in unoccupied regions 114 in a number of ways. For example, DMT devices may modify their EMI 106 in the course of operation. Computing devices may change a characteristic (such as frequency or clock signal shape) of their clock signal(s). These examples are illustrative, and are not intended to limit embodiments of the invention.

In one example, suppose that EMI emissions are to be maintained below some predefined, fixed level in a particular region of an electromagnetic spectrum if that region is occupied by other users, but in unoccupied regions, the EMI does not need to be confined to any particular level, and/or may be higher. Also suppose that devices at a given location may be allocated regions in the radio frequency spectrum identified by the frequency range 139.0 to 143.0 MHz, and that EMI emissions are to be maintained below some predefined, fixed level in those regions. For the given location, suppose that the regions identified by the frequency range 140.1 to 142.2 are unoccupied.

In one embodiment, if a given device emits EMI in the region 139.5 to 139.7, and if the regions identified by the frequency range 139.5 to 139.7 are occupied by other users, then the EMI may be reduced in the regions 139.5 to 139.7, and increased in the regions 140.1 to 142.2, which are unoccupied. In another embodiment, if the emitted EMI levels are unacceptable in the regions 139.5 go 139.7, then the EMI may be reduced in the regions 139.5 to 139.7, and increased in the regions 140.1 to 142.2, where they may be acceptable. In yet another embodiment, if the EMI 106 levels are unacceptable, and the regions 139.5 to 139.7 are occupied by other users, then the EMI 106 may be reduced in the regions 139.5 to 139.7, and increased in the regions 140.1 to 142.2.

CONCLUSION

Therefore, in one embodiment, a method comprises determining if a device emits electromagnetic interference (EMI) in one or more regions of an electromagnetic spectrum occupied by other users, and if the device emits EMI in one or more regions of an electromagnetic spectrum occupied by the other users, then reducing the EMI in the one or more regions occupied by the other users, and increasing the EMI in one or more other regions unoccupied by the other users.

The embodiments described herein may reduce EMI in regions occupied by other users. For example, non-communications devices may not be capable of meeting FCC defined EMI levels for all frequencies. By altering the EMI that is emitted into an occupied region of an electromagnetic spectrum, the EMI may be reduced from the occupied regions. In communications devices, for example, altering the EMI in a way to reduce it from one or more occupied regions of an electromagnetic spectrum, and to increase it in unoccupied regions of the electromagnetic spectrum, may enable the communication devices to increase the power of the signal injected into the channel. By the Shannon equation, this may also increase the device's transmission capabilities.

Furthermore, embodiments described herein may reduce EMI in areas occupied by other users without the need to incur shielding costs, or additional shielding costs, and may furthermore help reduce the shielding costs of a system in which a device is incorporated. For example, non-communications devices may use reduced-cost electromagnetic shielding, and communications devices may use minimally shielded or unshielded transmission media (such as copper). In these devices, embodiments of the invention may help further reduce EMI without increasing shielding costs.

In the foregoing specification, specific embodiments have been described. It will, however, be evident that various modifications and changes may be made to these embodiments without departing therefrom. The specification and drawings are, accordingly, to be regarded in an illustrative rather than a restrictive sense.

What is claimed is:

1. A method comprising:
   determining if a device emits electromagnetic interference (EMI) in one or more regions of an electromagnetic spectrum occupied by other users; and
   if it is determined that the device emits EMI in one or more regions of the electromagnetic spectrum occupied by other users:
      reducing the EMI in the one or more regions; and
      increasing the EMI in one or more other regions of the electromagnetic spectrum that are unoccupied by the other users.

2. The method of claim 1, wherein said reducing the EMI in the one or more regions comprises removing the EMI from the one or more regions.

3. The method of claim 1, wherein said method comprises determining if the device unintentionally emits EMI in one or more regions of an electromagnetic spectrum occupied by other users, and comprises reducing the EMI in the one or more regions, and increasing the EMI in one or more other regions if it is determined that the device unintentionally emits EMI in one or more regions of an electromagnetic spectrum occupied by other users.

4. The method of claim 3, wherein the device unintentionally emits EMI in one or more regions of a radio frequency spectrum occupied by licensed users of the radio frequency spectrum, and said increasing the EMI results in increasing the EMI in one or more other regions of the radio frequency spectrum that are unoccupied by the licensed users of the radio frequency spectrum.

5. The method of claim 1, wherein said determining if the device emits EMI in one or more regions of the electromagnetic spectrum occupied by other users comprises: determining a presence of other users at the device's location; and determining the one or more regions of the electromagnetic spectrum occupied by the other users at the location.

6. The method of claim 5, wherein said determining the presence of other users at the device's location comprises: determining a location of the device; and accessing a database of users at the location.

7. The method of claim 5, wherein said determining the presence of other users at the device's location comprises listening for the presence of other users.

8. The method of claim 5, wherein said determining the presence of other users at the location comprises determining the presence of other users licensed at the location.

9. An apparatus comprising:
   circuitry capable of determining if a device emits electromagnetic interference (EMI) in one or more regions of an electromagnetic spectrum occupied by other users; and
   if it is determined that the device emits EMI in the one or more regions of an electromagnetic spectrum occupied by other users, the circuitry additionally capable of:
   reducing the EMI in the one or more regions; and
   increasing the EMI in one or more other regions of the electromagnetic spectrum unoccupied by the other users.

10. The apparatus of claim 9, wherein said circuitry is additionally capable of removing the EMI from the one or more regions.

11. The apparatus of claim 9, wherein said circuitry is additionally capable of determining if the device unintentionally emits EMI in one or more regions of an electromagnetic spectrum occupied by other users, and of reducing the EMI in the one or more regions, and increasing the EMI in one or more other regions if the circuitry determines that the device unintentionally emits EMI in one or more regions of an electromagnetic spectrum occupied by other users.

12. The apparatus of claim 11, wherein the device unintentionally emits EMI in one or more regions of a radio frequency spectrum occupied by licensed users of the radio frequency spectrum, and said circuitry is additionally capable of increasing the EMI in one or more other regions of the radio frequency spectrum unoccupied by the licensed users of the radio frequency spectrum.

13. The apparatus of claim 9, wherein said circuitry is additionally capable of:
   determining a presence of other users at the device's location; and determining the one or more regions of the electromagnetic spectrum occupied by the other users at the location.

14. The apparatus of claim 13, wherein said circuitry is additionally capable of:
   determining a location of the device; and accessing a database of users at the location.

* * * * *